United States Patent
Min et al.

(10) Patent No.: US 7,663,884 B2
(45) Date of Patent: Feb. 16, 2010

(54) HEAT DISSIPATION DEVICE

(75) Inventors: Xu-Xin Min, Shenzhen (CN); Meng Fu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/248,004

(22) Filed: Oct. 8, 2008

(65) Prior Publication Data

US 2009/0244849 A1 Oct. 1, 2009

(30) Foreign Application Priority Data

Mar. 26, 2008 (CN) .................... 2008 1 0066346

(51) Int. Cl.
*H05K 7/20* (2006.01)
*F28F 7/00* (2006.01)
*H01L 23/34* (2006.01)

(52) U.S. Cl. ............... 361/704; 165/80.2; 165/80.3; 257/719; 361/719

(58) Field of Classification Search .......... 257/719
See application file for complete search history.

(56) References Cited

U.S. PATENT DOCUMENTS

| 5,870,286 | A | * | 2/1999 | Butterbaugh et al. | 361/704 |
| 6,153,932 | A | * | 11/2000 | Liang | 257/712 |
| 6,476,484 | B1 | * | 11/2002 | Liang | 257/718 |
| 6,644,396 | B2 | * | 11/2003 | Liang | 165/185 |
| 6,728,103 | B1 | * | 4/2004 | Smedberg | 361/703 |
| 7,307,842 | B1 | * | 12/2007 | Liang | 361/710 |
| 2009/0135552 | A1 | * | 5/2009 | Tu et al. | 361/676 |

* cited by examiner

*Primary Examiner*—Gregory D Thompson
(74) *Attorney, Agent, or Firm*—Frank R. Niranjan

(57) ABSTRACT

A heat dissipation device attached to a top surface of an electronic device mounted on a printed circuit board, includes a heat sink and a retainer securing the heat sink onto the electronic device. The retainer includes a frame, a plurality of baffle walls and protrusion posts extending downwardly from the frame. Lower ends of the baffle walls of the retainer extend downwardly through the heat sink and engage with engaging edges of the electronic device. The heat dissipation device is further provided with a plurality of elastic members which respectively surround the protrusion posts of the retainer and are compressed between the retainer and the heat sink, thereby pushing the heat sink downwardly toward the electronic device.

14 Claims, 5 Drawing Sheets

HEAT DISSIPATION DEVICE

BACKGROUND

1. Field of the Invention

The present invention relates to a heat dissipation device, and particularly to a heat dissipation device with a retainer for fastening the heat dissipation device to an electronic device.

2. Description of Related Art

With advancement of computer technology, electronic devices operate at a high speed. It is well known that the more rapidly the electronic devices operate, the more heat they generate. If the heat is not dissipated duly, the stability of the operation of the electronic devices will be impacted severely. Generally, in order to ensure the electronic device to run normally, a heat dissipation device is used to dissipate the heat generated by the electronic device.

Typically, a retainer is implemented in order to facilitate a close attachment of a heat sink onto an electronic device so as to efficiently dissipate heat created by the electronic device. The retainer usually includes a rectangular frame pressing downwardly against the heat sink and having baffle walls respectively extending downwardly from its four lateral sides, wherein a protruding hook is formed on an inner face of a lower portion of each baffle wall. In use of the retainer, the protruding hooks at the lower portions of the baffle walls extend through the heat sink and fasten to the electronic device or the printed circuit board on which the electronic device is mounted. However, the pressure directly exerted downwardly against the heat sink by the retainer is difficult to control to a proper level. When the fastening force is too small, the heat-dissipation efficiency is usually low because of loose attachment of the heat sink onto the electronic device. Conversely, when the fastening force is too large, it could possibly damage the electronic device.

What is needed, therefore, is a heat dissipation device having a retainer which could produce an appropriate fastening force and facilitate an attachment of a heat sink onto an electronic device.

SUMMARY

A heat dissipation device attached to a top surface of an electronic device mounted on a printed circuit board, includes a heat sink and a retainer securing the heat sink onto the electronic device. The retainer includes a frame, a plurality of baffle walls and protrusion posts extending downwardly from the frame. Lower ends of the baffle walls of the retainer extend downwardly through the heat sink and engage with edges of the electronic device. The heat dissipation device is further provided with a plurality of elastic members which are respectively mounted around the protrusion posts of the retainer and are located and compressed between the retainer and the heat sink.

Other advantages and novel features of the present invention will become more apparent from the following detailed description of an embodiment/embodiments when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION

Figure 1:
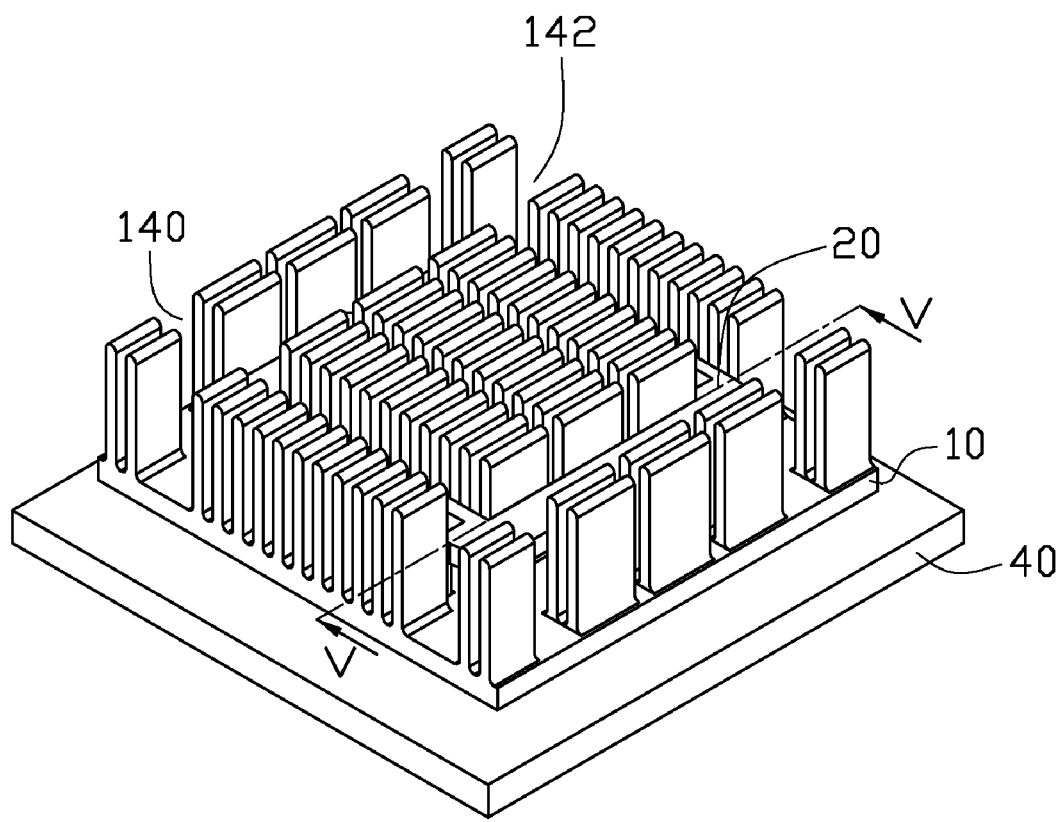
FIG. 1 is an assembled view of a heat dissipation device in accordance with a preferred embodiment of the present invention, together with a circuit board having an electronic component mounted thereon.
Figure 2:
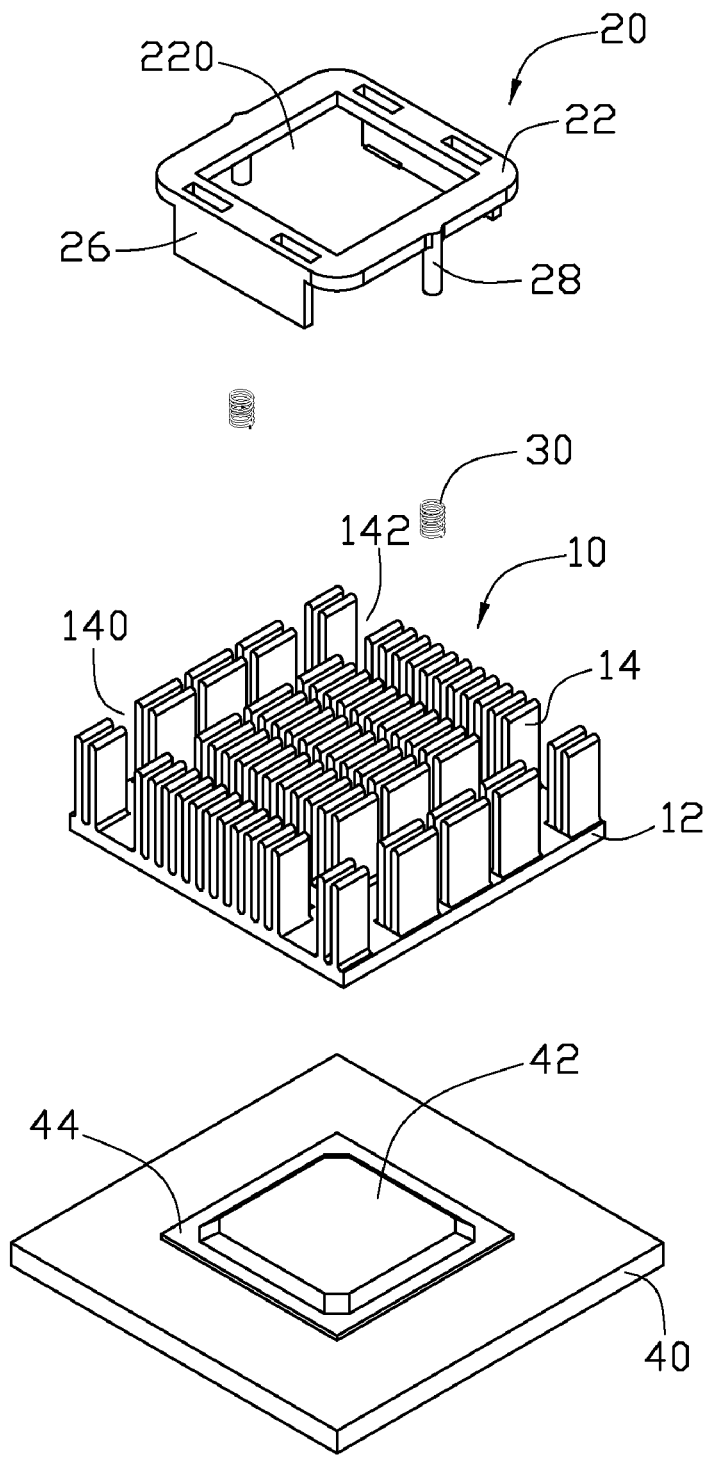
FIG. 2 is an exploded view of FIG. 1.

Referring to FIGS. 1-2, a heat dissipation device in accordance with a preferred embodiment of the present invention is illustrated. The heat dissipation device is mounted on a printed circuit board 40 to remove heat generated by an electronic device 42 mounted on the printed circuit board 40. The heat dissipation device includes a heat sink 10 and a retainer 20 securing the heat sink 10 onto the electronic device 42. The heat dissipation device is further provided with a plurality of elastic members such as two springs 30 located between the retainer 20 and the heat sink 10. The electronic device 42 is provided with engaging edges 44 at a circumference thereof for engaging with the retainer 20.

Figure 3:
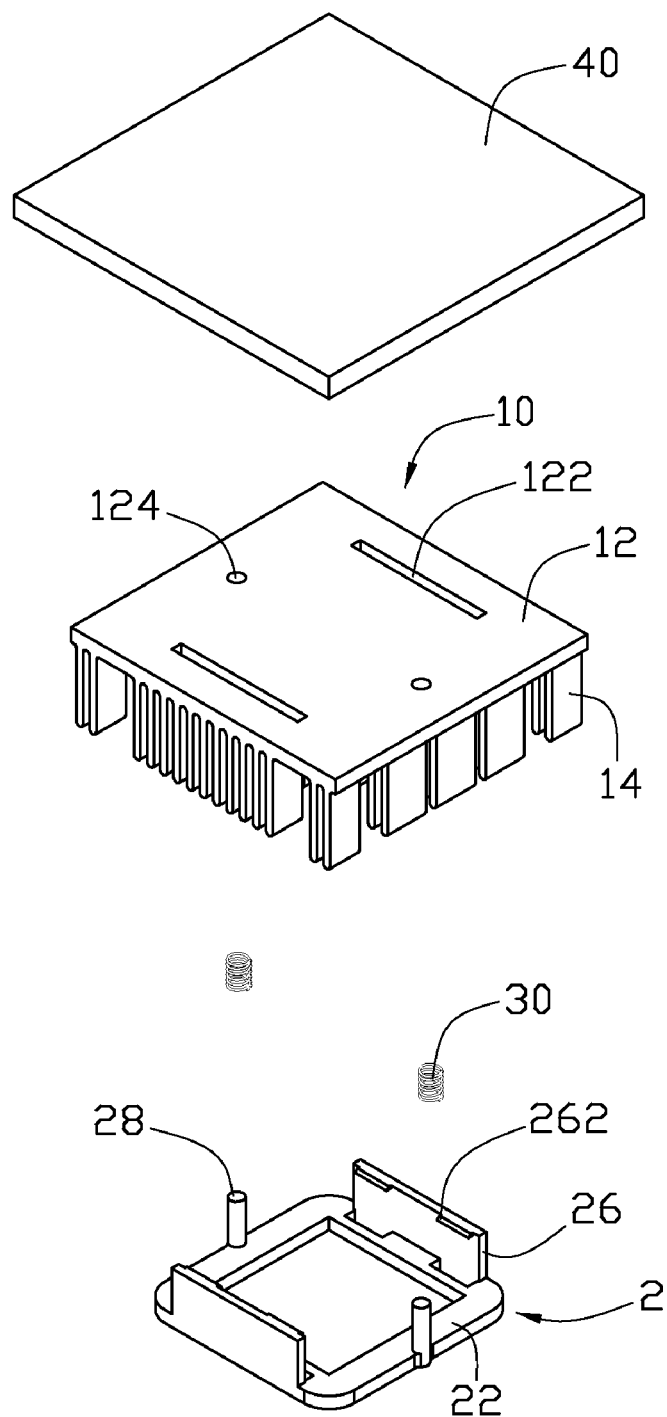
FIG. 3 is an inverted, exploded view of FIG. 1.

Also referring to FIG. 3, the heat sink 10 is integrally extruded from a heat conductive material, such as aluminum, and comprises a rectangular base 12 and a plurality of fins 14 extending upwardly and perpendicularly from the base 12. The base 12 has a bottom face in contact with the top surface of the electronic device 42 for adsorbing heat from the electronic device 42. The fins 14 are parallel to and spaced from each other. The heat sink 10 defines two pairs of elongated channels 140,142 between the fins 14 for receiving the retainer 20. The two pairs of channels 140,142 are respectively parallel and adjacent to two pairs of opposite sides of the base 12. The base 12 therein defines two through elongated slots 122 respectively located at middle portions of the channels 140 and two through holes 124 respectively located at middle points of the channels 142, for a downward extension of the retainer 20 therethrough to secure the heat sink 10 on the electronic device 42. The two through slots 122 are elongated and parallel to each other.

Figure 4:
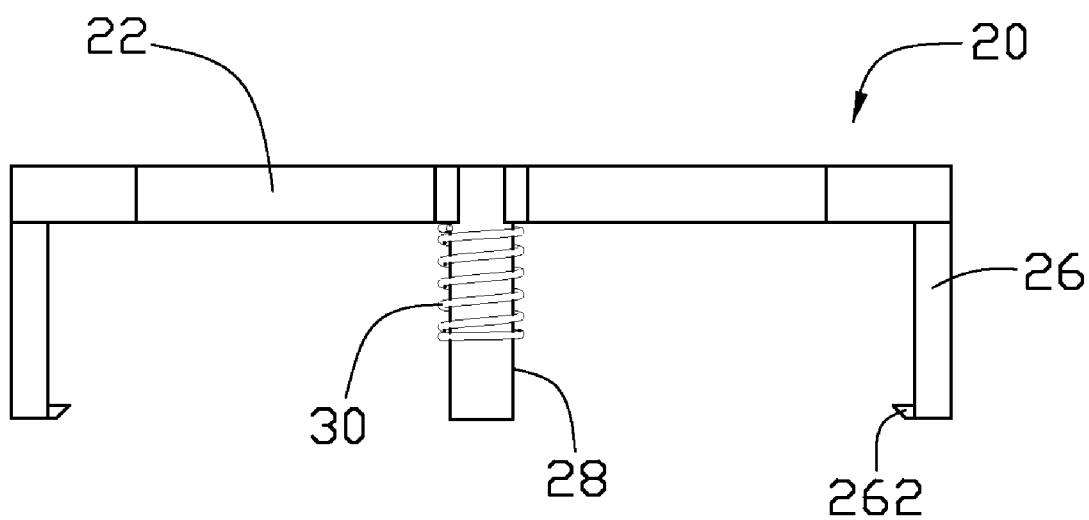
FIG. 4 is a front elevation view of a retainer of the heat dissipation device in FIG. 1.

Referring to FIGS. 2-4, the retainer 20 comprises a frame 22, two baffle walls 26 respectively extending downwardly and perpendicularly from two opposite sides of the frame 22 and two protrusion posts 28 respectively extending downwardly and perpendicularly from middle portions of the other two opposite sides of the frame 22. The frame 22 is a flat plate having a rectangular configuration and defines a rectangular opening 220 in a centre portion thereof for a part of the fins 14 of the heat sink 10 extending upwardly therethrough. Two spaced fastening hooks 262 protrude inwards from a lower end of each baffle wall 26. The protrusion posts 28 each have a height equal to or less than that of each baffle wall 26. The baffle walls 26 are used to extend downwardly through the corresponding through slots 122 of the heat sink 10 and engage with the engaging edges 44 of the electronic device 42. The protrusion posts 28 are used to extend downwardly through the corresponding through holes 124 of the heat sink 10. The two springs 30 are used to be respectively mounted around the two protrusion posts 28 of the retainer 20 and compressed between the frame 22 of the retainer 20 and the base 12 of the heat sink 10.

Figure 5:
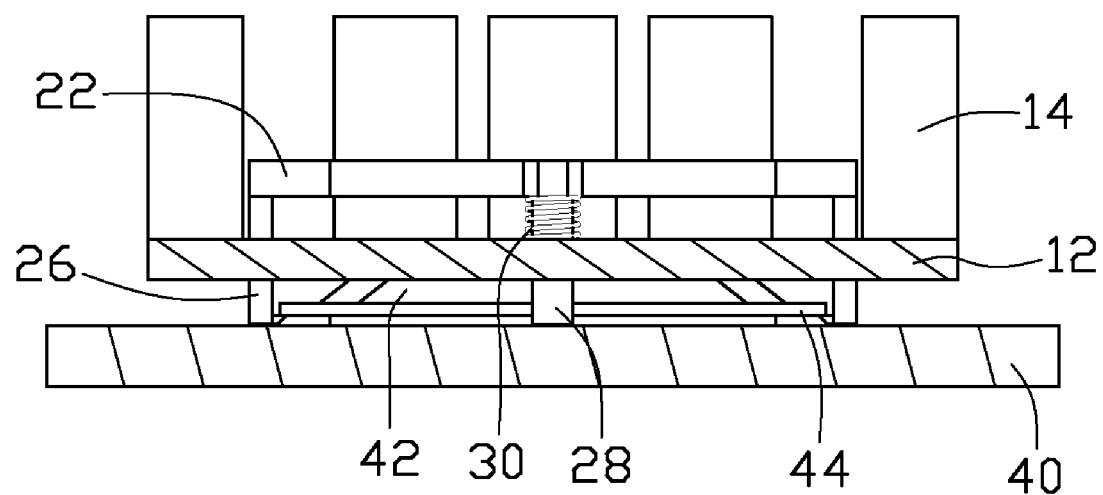
FIG. 5 is a cross-section view taken along line V-V of FIG. 1.

Also referring to FIG. 5, in assembling of the heat dissipation device, the heat sink 10 is placed on the electronic device 42. The baffle walls 26 and the protrusion posts 28 each surrounded by a corresponding spring 30 are respectively received in the through slots 122 and the through holes 124 of the heat sink 10. The fastening hooks 262 of the baffle walls 26 extend through the two respective through slots 122 and clasp the engaging edges 44 of the electronic device 42, to thus couple the retainer 20 to the heat sink 10. At the same time, the springs 30 respectively encircling the protrusion posts 28 are compressed between a top surface of the base 12 of the heat sink 10 and a bottom surface of the frame 22 of the retainer 20. Thus, the heat sink 10 can tightly and closely contact with the electronic device 42 due to force exerted by the springs 30 on the heat sink 10 to urge the heat sink 10 towards the electronic device 42. Additionally, an amount of the force exerted by the springs 30 can be approximately calculated from an elastic coefficient and compressed length of the springs 30. Thus, an appropriate force exerted by the heat sink 10 on the electronic device 42 can be easily obtained.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device adapted for removing heat from a heat-generating electronic device, comprising:
    a heat sink comprising a base having a bottom surface contacting with the electronic device and a plurality of fins extending upwardly from a top surface of the base;
    a retainer comprising a frame, two baffle walls and two protrusion posts all extending downwardly from the frame and through the base of the heat sink, the baffle walls having lower ends fastening with engaging edges of the electronic device; and
    two elastic members each encircling a corresponding one of the two protrusion posts and compressed between the base of the heat sink and the retainer;
    wherein the frame has four straight inner walls cooperatively defining an entirety of a contour of a rectangular opening which is totally void through a central portion of the frame, and the fins extend upwardly through the opening.

2. The heat dissipation device as claimed in claim 1, wherein the frame is a flat plate and has a rectangular configuration, and each of the two baffle walls extends downwardly from a corresponding one of two opposite sides of the frame, while each of the two protrusion posts extends downwardly from a corresponding one of another two opposite sides of the frame.

3. The heat dissipation device as claimed in claim 1, wherein the baffle walls and the protrusion posts are perpendicular to the frame.

4. The heat dissipation device as claimed in claim 1, wherein the protrusion posts each have a height equal to or less than that of each baffle wall.

5. The heat dissipation device as claimed in claim 1, wherein the two baffle walls have fastening hooks protruding inwards respectively from the lower ends thereof and clasping the engaging edges of the electronic device.

6. The heat dissipation device as claimed in claim 1, wherein the base of the heat sink defines two elongated through slots receiving the baffle walls and two through holes receiving the protrusion posts.

7. The heat dissipation device as claimed in claim 6, wherein the heat sink defines two pairs of elongated channels between the fins and respectively parallel and adjacent to two pairs of opposite sides of the base for receiving the retainer.

8. The heat dissipation device as claimed in claim 7, wherein the two elongated through slots are located at middle portions of one pair of the channels, the two through holes are located at middle points of the other pair of the channels.

9. The heat dissipation device as claimed in claim 1, wherein the two elastic members each are a spring encircling the corresponding one of the two protrusion posts and compressed between a top surface of the base of the heat sink and a bottom surface of the frame of the retainer.

10. A heat dissipation device adapted for removing heat from a heat-generating electronic device, comprising:
    a heat sink comprising a base having a bottom surface adapted for contacting with the electronic device and a plurality of fins extending upwardly from a top surface of the base;
    a retainer comprising a rectangular frame, two baffle walls extending downwardly and respectively from two opposite sides of the frame and two protrusion posts extending downwardly and respectively from the other two opposite sides of the frame; and
    two springs each encircling a corresponding one of the two protrusion posts;
    wherein the baffle walls have lower ends adapted for fastening with engaging edges of the electronic device, and the protrusion posts each having a corresponding spring mounted therearound have lower ends thereof extending downwardly through the base to make the springs compressed between the base of the heat sink and the retainer; and
    wherein the frame has four straight inner walls cooperatively defining an entirety of a contour of a rectangular opening which is totally void through a central portion of the frame, and the fins extend upwardly through the opening.

11. The heat dissipation device as claimed in claim 10, wherein the base defines two through holes for extension of the protrusion posts therethrough.

12. The heat dissipation device as claimed in claim 10, wherein the baffle walls and the protrusion posts are perpendicular to the frame.

13. The heat dissipation device as claimed in claim 10, wherein each protrusion post has a height equal to or less than that of each baffle wall.

14. The heat dissipation device as claimed in claim 10, wherein two spaced fastening hooks protrude inwards from a lower end of each baffle wall, the fastening hooks being adapted for clasping bottom surfaces of the engaging edges of the electronic device.

* * * * *